United States Patent [19]
Routh et al.

[11] Patent Number: 5,105,099
[45] Date of Patent: Apr. 14, 1992

[54] LEVEL SHIFT CIRCUIT WITH COMMON MODE REJECTION

[75] Inventors: Kevin C. Routh; Thomas A. Jochum, both of Durham, N.C.

[73] Assignee: Harris Corporation, Melbourne, Fla.

[21] Appl. No.: 663,224

[22] Filed: Mar. 1, 1991

[51] Int. Cl.$^5$ .................... H03K 3/013; H02M 7/53
[52] U.S. Cl. ................................ 307/270; 307/296.1; 363/56; 363/131
[58] Field of Search .............. 307/270, 596, 296.1, 307/296.5; 363/55, 56, 57, 58, 95, 96, 97, 98, 99, 131, 132, 133, 134, 135, 136, 137, 138, 139

[56] References Cited
U.S. PATENT DOCUMENTS
4,078,247  3/1978  Albrecht .................... 363/136 X Primary Examiner—David Mis
Attorney, Agent, or Firm—Henry I. Schanzer

[57] ABSTRACT

A system includes an upper driver circuit connected between a first source of voltage and a first point of reference potential, for driving the gate of a first switching device having a main current path connected between a second source of operating voltage and the first point of reference potential. The system further includes a lower driver circuit connected between a third source of operating voltage and a second point of reference potential, for driving the gate of a second switching device having a main current path connected between the first and second points of reference potential. Detection circuitry is included for detecting a common-mode dv/dt induced signal to disable the sensing of valid "ON" and "OFF" signals by the upper circuit, to prevent false triggering of the upper circuit.

22 Claims, 5 Drawing Sheets

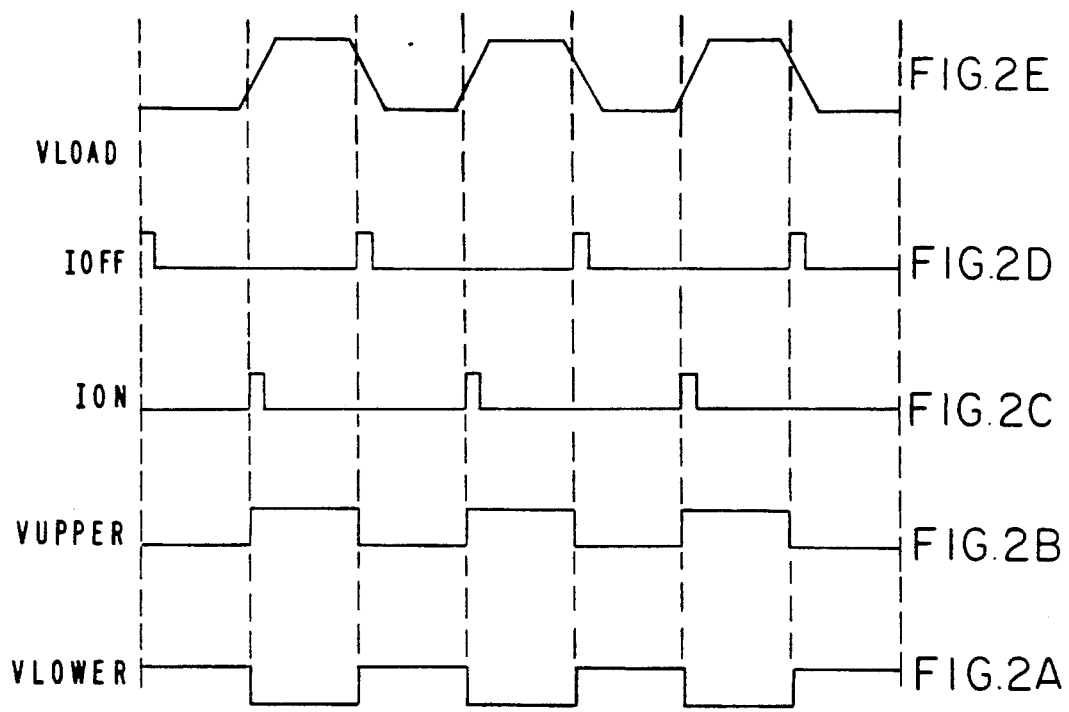
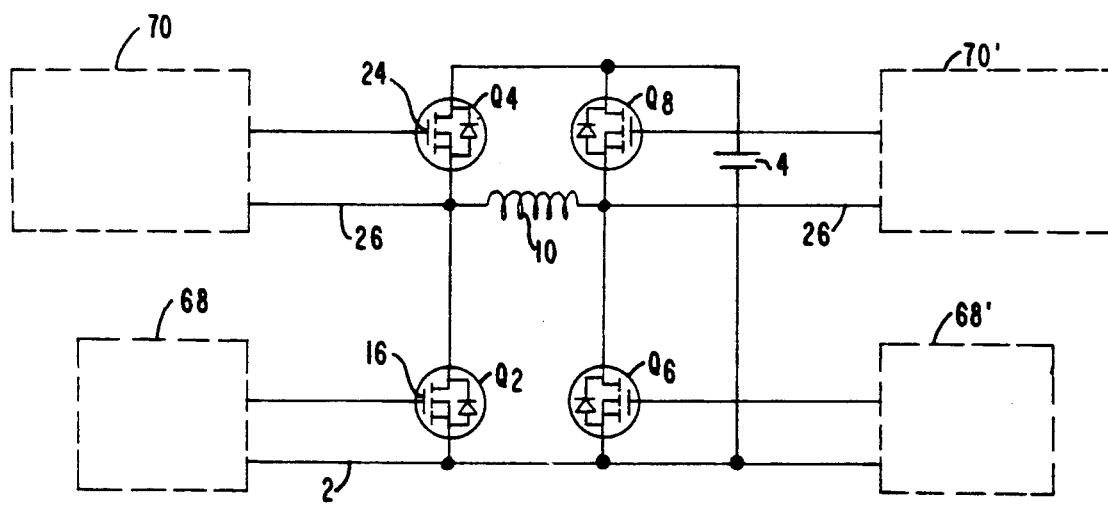
FIG. 3

LEVEL SHIFT CIRCUIT WITH COMMON MODE REJECTION

BACKGROUND OF THE INVENTION

In some circuits a first transistor may be connected between a first point of operating potential (e.g. ground) and a load terminal, and a second transistor may be connected between the load terminal and a second point of operating potential (e.g. a very high positive voltage). Where the first and second transistor switches are of the same conductivity type, control circuits for the first transistor can be referenced to ground, but the control circuits for the second transistor must be referenced to the voltage at the load terminal. Usually, the sources of control signals for the transistors are referenced to ground so that the control signal for the first transistor, that is the one referenced to ground, can be directly applied to its control electrode. However, since the second transistor is referenced to the load terminal voltage, the control signal to turn it on or off must have its level shifted so that it is referenced to the voltage at the load terminal rather than to ground.

One way of doing this is to derive narrow voltage pulses at the beginning and end of each control signal which have durations equal to the time that the second transistor is to be activated, and converting these pulses to current pulses with current supplies that are referenced to ground. The current pulses are converted to voltage pulses referenced to the voltage at the load terminal by passing the current pulses through resistors that are respectively connected in series with each current supply and a D.C. operational voltage referenced to the load terminal.

When the transistors are driving an inductive load, the opening of the first switch, which is referenced to ground, induces voltage changes (transients, dv/dt, etc.) that cause currents to flow through stray capacitances and the resistors referred to so as to possibly cause false operation of a bistable circuit, in turn causing false operation of the transistor switches it controls. Because the voltages produced across the resistors occur at the same time, they are referred to as common mode voltages.

One way of coping with this problem has been to provide circuits for opening the second transistor, i.e. the one referenced to the intermediate voltage, when the common mode voltages occur, but this can result in noise induced turn-off when high voltage bus noise occurs. Alternatively, the second transistor could be closed rather than opened in response to the presence of common mode voltages, but this can result in noise induced turn-ons.

Another approach has been to make the circuits associated with the resistors identical and to design the bistable device so that it does not respond to identical signals. Unfortunately, the common mode voltages may not be identical and the circuit is sensitive to layout mismatches that may result from processing irregularities.

BRIEF SUMMARY OF THE INVENTION

A transistor switch is coupled between a first power terminal and a load terminal to drive a load connected at the load terminal towards the voltage (VHV) applied at the first power terminal.

The transistor switch is driven by control circuitry connected between the load terminal and a first voltage terminal at which is applied a first voltage which is used, in part, to power the control circuitry and to turn-on the transistor switch. The transistor switch is turned on via a signal appearing at a first node of the control circuitry and is turned off in response to a signal appearing at a second node of the control circuitry.

Noise pulses appearing at the load terminal may be coupled via the control circuitry to the first and second nodes, whereby there can be erroneously generated a turn on pulse to the transistor switch when it should be off, or to turn it off when it should be on.

The invention includes means in the control circuitry for sensing when the voltages at the first and second nodes are of similar value (which typically results from a noise condition) and for then generating an inhibit signal for preventing the transistor switch from changing state.

BRIEF DESCRIPTION OF THE DRAWINGS

Various preferred embodiments of the present invention will be described below with reference to the accompanying drawings in which like items are indicated by the same reference designations and in which:

FIG. 2A is a waveform appearing at point A in FIG. representing a control pulse voltage signal for the switch referenced to ground;

FIG. 2B is a waveform appearing at point B in the circuit of FIG. 1 representing a control pulse voltage signal for the switch referenced to an intermediate voltage;

FIG. 2C is a waveform appearing at point C in the circuit of FIG. 1 representing the narrow current pulses at the beginning of each of the control pulse signals of FIG. 2B;

FIG. 2D is a waveform appearing at point D in the circuit of FIG. 1 representing the narrow current pulses at the end of each of the control pulse signal of FIG. 2B;

FIG. 2E is a waveform appearing across the load at point E in the circuit of FIG. 1 representing the voltage across the load; and FIG. 3 is a schematic diagram of a pulsed full bridge power supply incorporating this invention.

DETAILED DESCRIPTION OF THE INVENTION

Figure 1:
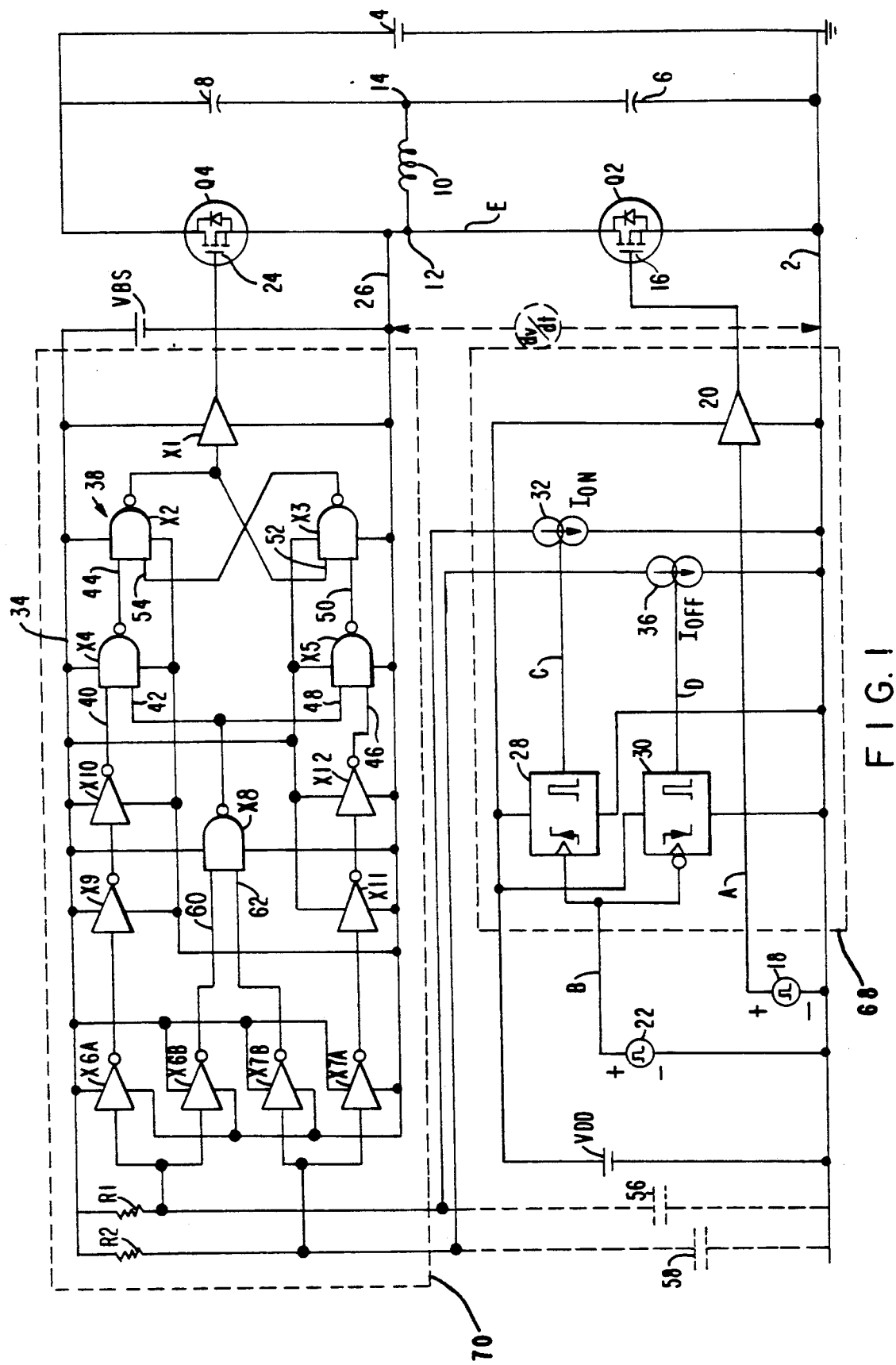
FIG. 1 is a schematic diagram of a pulsed half bridge power supply incorporating this invention.
Figure 4:
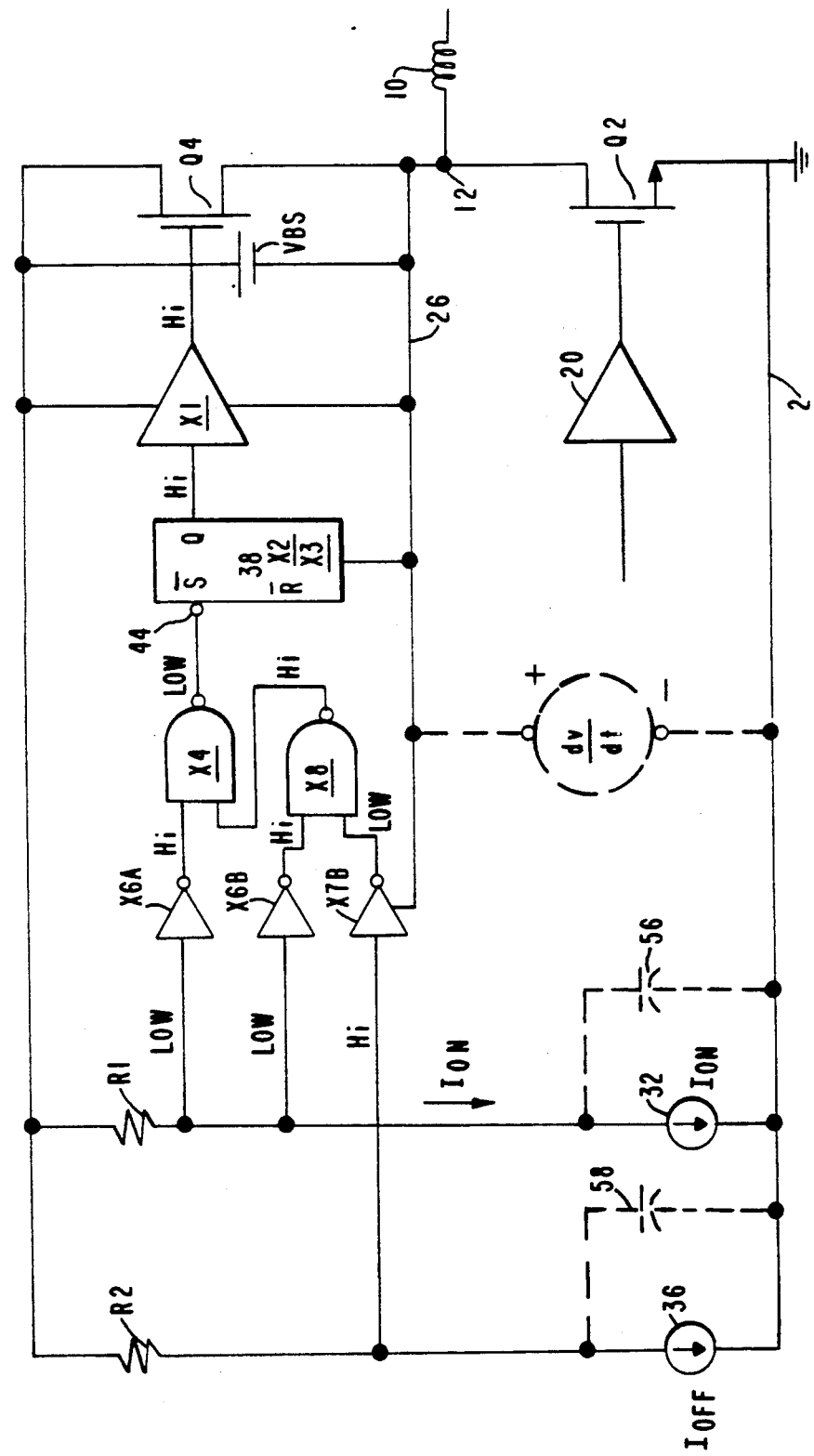
FIG. 4 is a schematic diagram of a portion of FIG. 1 required for the mode of operation in which the power switch not referenced to the reference potential for the system is made conductive.
Figure 5:
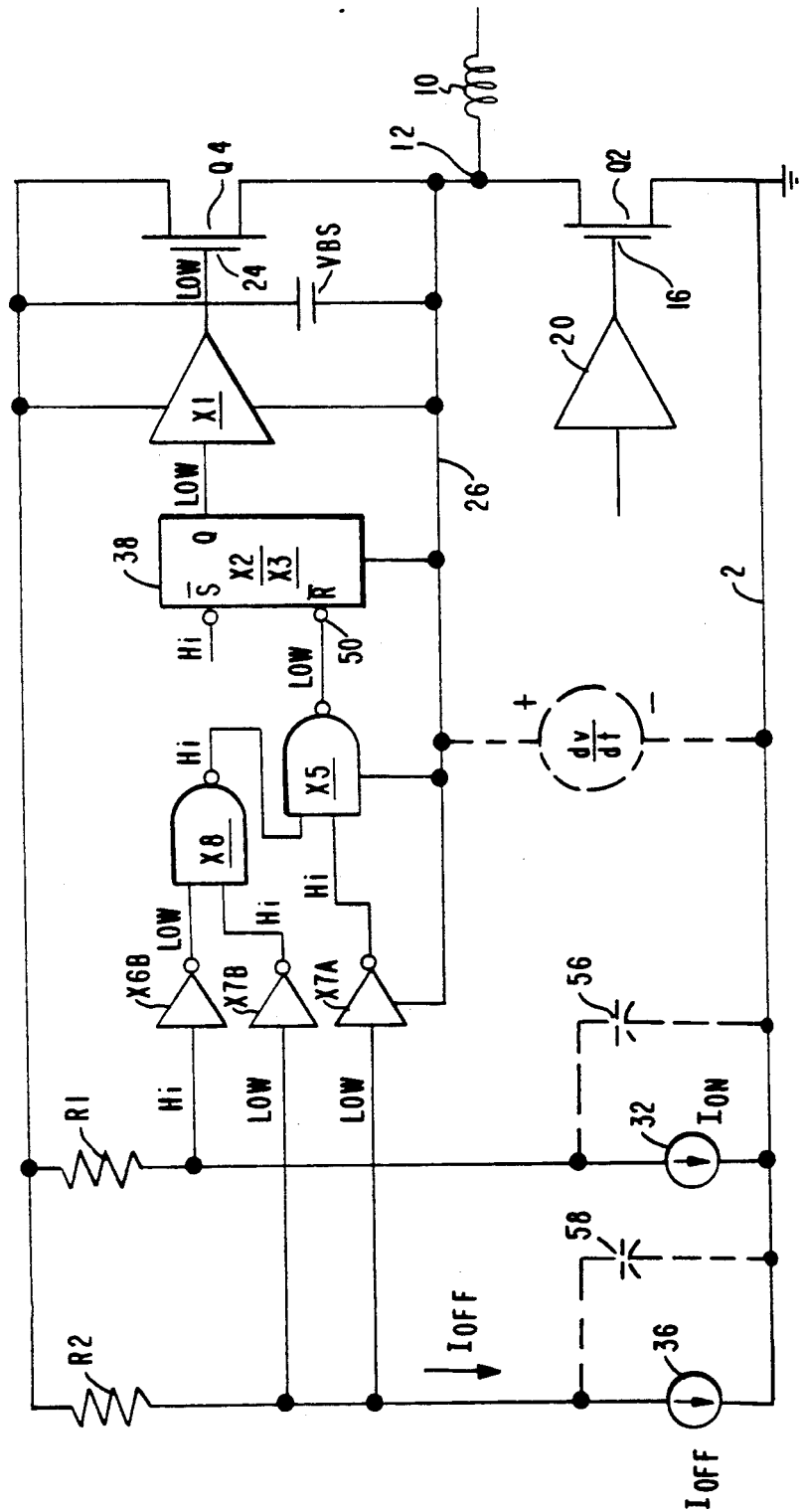
FIG. 5 is a schematic diagram of a portion of FIG. 1 required for the mode of operation in which the power switch not referenced to the reference potential for the system is made non-conductive.
Figure 6:
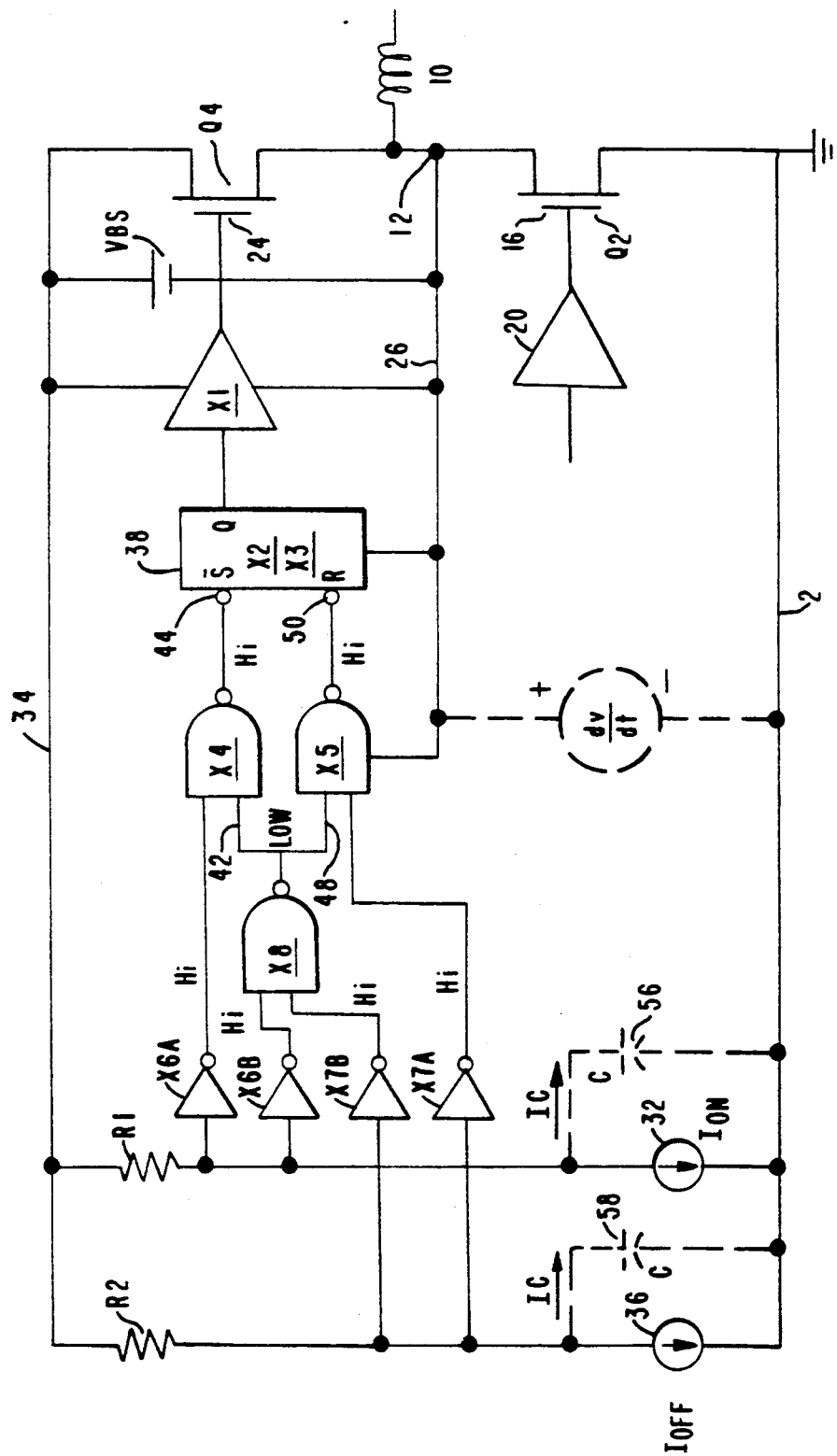
FIG. 6 is a schematic diagram of a portion of FIG. 1 required in accordance with the invention for the mode of operation occurring in the presence of common mode voltages.

Immediately following is a description of the entire system of the invention shown in FIG. 1, but detailed descriptions of separate modes of operation will be presented in connection with FIGS. 4, 5 and 6.

In the half bridge power driver of FIG. 1, switches Q2 and Q4 are MOS gated transistors of the same (N-type) conductivity type. Each transistor has a source electrode and a drain electrode defining the ends of the conduction path and a gate electrode whose applied potential with respect to the source electrode determines the conductivity level in its conduction path. The conduction paths of transistor switches Q2 and Q4 are connected in series between a reference bus 2, which is shown at ground potential, and the positive terminal of a D.C. power supply voltage 4 having its negative terminal connected to the bus 2. Capacitors 6 and 8 are connected in series across the supply 4, and a load 10 is connected between the junction 12 of the switches Q2 and Q4 and the junction 14 of the capacitors 6 and 8.

In operation, the switch Q2 is closed during positive pulses of a control signal voltage wave of FIG. 2A that is supplied to a control electrode 16 of the switch Q2 from a control signal source 18 via a driver 20. The switch Q2, the source 18 and the driver 20 are all referenced to a first reference potential, herein shown as being ground potential on the bus 2.

The switch Q4 is to be closed during positive pulses of a control signal voltage wave of FIG. 2B that are provided by a source 22. The control signal voltage pulses of FIG. 2B are not applied directly to the control electrode 24 of the switch Q4 because they are referenced to the potential on the bus 2 and the control electrode 24 is referenced to a second reference potential, herein shown as being the voltage at the junction 12 to which a bus 26 is connected. Therefore, these control signal voltage pulses must be shifted in level before they are applied to the control electrode 24 of the switch Q4.

The required shift in level is achieved as follows. The control signal pulses of FIG. 2B are coupled from the signal source 22 to a control electrode of a rising edge triggered one shot multivibrator 28 and to the control electrode of a falling edge triggered one shot multivibrator 30. The multivibrators 28 and 30 provide narrow voltage pulses that respectively occur at the leading and trailing edges of the pulses shown in FIG. 2B. Driver 20, and one-shot multivibrators 28 and 30 are powered by D.C. voltage source VDD.

The ungrounded side of a current generator 32 is connected via a resistor R1 to a bus 34 that is placed at a positive operating potential with respect to the bus 26 by a source VBS of D.C. operating potential that is connected between the busses 26 and 34. The narrow voltage pulses at the output of the multivibrator 28 are applied to the current generator 32 that is referenced to the reference bus 2 so as to produce corresponding narrow pulses of current through resistor R1, as shown in FIG. 2C, that flow to ground and occur at the start of each positive control signal pulse shown in FIG. 2B. The pulses of voltage produced at the lower end of the resistor R1 correspond to the current pulses in FIG. 2C and are negative with respect to the positive voltage of the bus 34 so as to be indirectly referenced to the voltage at the bus 26.

The ungrounded side of a current generator 36 is connected via a resistor R2 to the bus 34. The narrow voltage pulses at the output of the multivibrator 30 are applied to the current generator 36 that is referenced to the bus so as to produce corresponding narrow pulses of current flowing through resistor R2, as shown in FIG. 2D, that flow to ground and occur at the end of each positive control signal pulse shown in FIG. 2B. The pulses of voltage produced at the lower end of the resistor R2 correspond to the pulses in FIG. 2D and are negative with respect to the positive voltage on the bus 34 so as to be indirectly referenced to the voltage of the bus 26.

Although the control signal pulses of FIG. 2B could produce corresponding pulses of current that are referenced to the bus 26 by applying them to a current source and a resistor, the power loss would be much greater.

In the circuit of FIG. 1 it is apparent that the short pulses of voltage produced across the resistor R1 cannot be applied directly to the control electrode 24 of the switch Q4 because they would close it for short intervals at the leading edges of the control signal pulses of FIG. 2B rather than during the control signal pulses as required. Therefore, the short voltage pulses across the resistor R1 which occur at the same time as the pulses in FIG. 2C, are applied to a SET input of a latch 38 comprised of cross coupled NAND gates X2 and X3 so as to cause a high voltage to be applied to the control electrode 24 of the switch Q4 via a driver X1. This causes the switch Q4 to remain closed until the latch 38 is triggered into its other stable state in response to the negative pulses across the resistor R2 that are coupled to the RESET input of the latch 38 and occur at the times of the pulses in FIG. 2D.

The circuit details for producing this operation are as follows. The bottom of the resistor R1 is coupled via series inverters X6A, X9, and X10 to one input 40 of a NAND gate X4. By means to be described, the other input 42 of the gate X4 is placed in a high state when common mode voltages are not present on the resistors R1 and R2. The output of the NAND gate X4 is connected to a SET input of the latch 38 which is the input 44 of the NAND gate X2. The bottom of the resistor R2 is coupled via series inverters X7A, X11, and X12 to one input 46 of a NAND gate X5. By means to be described, its other input 48 is placed in a high state when no common mode voltage is present on the resistors R1 and R2. The output of the NAND gate X5 is connected to the RESET input of the latch 38, which is at the input 50 of the NAND gate X3.

Operation of the circuit just described is as follows. When a low voltage pulse appears at the bottom of the resistor R1 at the start of a switch control pulse of FIG. 2B, the input 44 of the NAND gate X2 is driven low so as to cause the output to be high and close the switch Q4. At the same time, the voltage at the bottom of the resistor R2 is high so as to cause the input 50 of the NAND gate X3 to be high. Since its other input 52 is coupled to the output of the NAND gate X2, it is high. Both inputs of the NAND gate X3 being high cause its output that is coupled to an input 54 of the NAND gate X2 to be low. Thus, when the short negative pulse across the resistor R1 ceases, the latch 38 will remain in this stable state where the output of the NAND gate X2 is high so as to keep the switch Q4 closed.

Now, when the bottom of the resistor R2 goes low in response to the next current pulse of FIG. 2D, which occurs at the trailing end of the switch control voltage pulse of FIG. 2B, the input 50 of the NAND gate X3 is driven low so that its output goes high. This causes the output of the NAND gate X2 to go low and open the switch Q4. This condition remains until the next pulse in FIG. 2C again causes the bottom of the resistor R1 to go low, and the operation previously described is repeated.

With the circuit thus far described, false triggering of the switch Q4 can occur when the switch Q2 is opened if the load 10 is inductive for the following reasons. A voltage is produced due to the cessation of current in the load 10 between the reference bus and the bus 26, as indicated by the phantom circle dv/dt. This dv/dt voltage causes currents to flow through resistors R1 and R2 via stray capacitances between them and the bus 2. These stray capacitances are indicated in phantom at 56 and 58, respectively. If the circuits driving the SET and RESET inputs of the bistable device or latch 38 are not identical, the device 38 will be put in one state or the other. Although the undesired voltages thus produced across resistors R1 and R2 may not be exactly equal, they are nearly so and are referred to as common mode voltages. Common mode voltages across resistors R1 and R2 can be caused in other ways as well, such as electrical noise on bus 34.

In order to prevent common mode voltages from affecting the operation of switch Q4, means are provided for preventing NAND gates X4 and X5 from respectively responding to voltages across resistors R1 and R2 so that the state of the bistable device 38 is not changed. In this particular circuit, a NAND gate X8 has one input 60 coupled to the bottom of the resistor R1 via an inverter X6B and another input 62 coupled to the bottom of the resistor R2 via an inverter X7B. The output of the NAND gate X8 is connected to the input 42 of the NAND gate X4 and to the input 48 of the NAND gate X5. When the voltage at resistor R1 is high and the voltage at resistor R2 is low, or vice versa, one of the inputs 60 and 62 of the NAND gate X8 is high and the other is low. This will cause the output of NAND gate X8 to be high, which will cause a high voltage to be applied to the inputs 42 and 48 of the NAND gates X4 and X5 as was previously stated. However, when sufficiently large negative common mode voltages appear across both resistors R1 and R2, both inputs 60 and 62 of the NAND gate X8 are high, thus making its output low. When this occurs, the outputs of the NAND gates X4 and X5 cannot go low so that the output of the NAND gates X2 and X3 cannot go high in order to close or open the switch Q4.

By making the threshold voltages of the inverters X6B and X7B, which are the voltages at the inputs at which the output changes state, equal to ⅔ voltage of the supply VBS and the thresholds of the inverters X6A and X7A equal to ⅓ this voltage, the inverters X6B and X7B are made more sensitive than the inverters X6A and X7A so that the NAND gates X4 and X5 are prevented from producing voltages that will operate the switch Q4 before they are affected by voltages applied to the inverters X6A and X7A from the resistors R1 and R2. Thus, if the currents through the resistors R1 and R2 reduce the voltage across them to ⅔ of the voltage of the supply VBS, then the outputs of inverters X6B and X7B will change from negative (−) to positive (+), but the inverters X6A and X7A will not change, i.e. their outputs remain negative (−). The outputs of inverters X6A and X7A will change from negative (−) to positive (+) when the voltage across the resistors is reduced to ⅓ the voltage of the supply. Therefore, the common mode disable voltage at the output of the NAND gate X8 occurs at a lower common mode voltage so as to act before the outputs of the inverters X6A and X7A change state. This provides a margin of noise protection.

Instead of making the threshold of the inverters X6A and X7A higher than the thresholds of the inverters X6B and X7B for the common mode circuit, the thresholds of any or all of each series inverters X6A, X9 and X10; and X7A, X11 and X12, could be made higher so as to achieve the same result.

The purpose of the inverters X9, X10, X11 and X12 is to prevent a race condition by providing a suitable delay, but this also assures that the output of the NAND gate X8 produced in response to DC or low frequency common mode voltages will reach the inputs 42 and 48 of the NAND gates X4 and X5, respectively, so as to disable them before any voltage can reach them via the respective series strings of inverters. The relative sensitivities brought about by using different thresholds is especially effective for high frequency common mode voltages.

FIG. 3 shows the application of the invention to a full bridge power circuit in which the capacitors 6 and 8 of FIG. 1 are replaced with switches Q6 and Q8. Because of the fact that the control electrode of the switch Q8 is referenced to the voltage at the junction of Q6 and Q8, the circuits respectively contained within the dashed rectangles 68 and 70 of FIG. 1, are used, within rectangles 68' and 70', respectively.

Reference is made to FIG. 4 which shows parts of FIG. 1 that are necessary for an understanding of the mode of operation in which the power switch Q4 is turned on. The logic lows and highs at various points in the circuit are indicated. A current ION is drawn through R1 from the current source 32 has a value such that ION * R1 > ⅔ * VBS. This signal propagates through X6A and X6B, but since IOFF is zero, X7B is unaffected. Therefore, the output of the NAND gate X8 is unaffected (high). This allows the signal to propagate through X4 and present a low level to the SET input 44 of the bistable latch 38, which includes the NAND gates X2 and X3 as previously explained. There is no dv/dt present on the node 12 so that the currents due to the parasitic capacitors 56 and 58 are zero.

Reference is now made to FIG. 5, which shows parts of FIG. 1 which are necessary for understanding of the mode of operation in which the power switch Q4 is turned off. The logic lows and highs at various points in the circuit are indicated. A current IOFF, drawn through R2 from the current source 36 has a value such that IOFF * R2 > ⅔ * VBS. This signal propagates through X7A and X7B, but since ION is zero, X6B is unaffected. Therefore, the output of the NAND gate X8 is unaffected (high). This allows the signal to propagate through X5 and present a low level to the RESET input 50 of the latch 38 that is comprised of NAND gates X2 and X3. There is no dv/dt present on the node 12 so that currents due to the parasitic capacitors 56 and 58 are zero.

Reference is now made to FIG. 6, which shows the parts of FIG. 1 that are necessary for an understanding of the mode of operation in which dv/dt voltage is present. The logic lows and highs at various points in the circuit are indicated. If, for some reason there is a large dv/dt at the bridge output node 12 or the bus 34, currents IC=(dv/dt)(C) flow in the parasitic capacitors 56, 58. These currents will be approximately the same. Assuming these currents are large enough to cause output transitions of X6B and X7B, both inputs of the NAND gate X8 will be high, thus presenting a low (disable) signal on input 42 of X4 and input 48 of X5. Because X6B and X7B have thresholds of ⅔ VBS, a dv/dt current such that (IC)(RI) > ⅓ VBS will cause the output of the NAND gate X8 to be low. Because the inputs of X6B and X7B are twice as sensitive as the inputs of X6A and X7A, the common mode disable signal at the output of X8 occurs sooner than the SET or RESET signals at the outputs of X6A and X7A respectively. This provides noise margin. If the dv/dt induced current, IC, is barely enough to activate X8, it is half of what is required to produce valid SET and RESET signals.

Although various embodiments of the invention have been described herein for purposes of illustration, they are not meant to be limiting. Variations and modifications of these embodiments of the inventions may occur to those of ordinary skill in the art, which modifications are meant to be covered by the spirit and scope of the appended claims.

We claim:

1. A circuit including first and second power switches that are connected with their respective current paths in series between source of a first power voltage and a source of a second power voltage where said first power switch is referenced to said first power voltage and said second power switch is referenced to a node at a junction of said current paths, said circuit preventing false operation in the presence of noise and comprising:
   means for operating said first switch in response to control pulses from a source that is referenced to said first power voltage;
   a source of control pulses for controlling said second switch;
   means for producing narrower pulses across respective impedances in response to the leading and trailing edges of said control pulses for said second switch, said narrower pulses being referenced to said node;
   closing means for said second switch responsive to the occurrence of only said narrower pulses produced in response to said leading edges;
   opening means for said second switch responsive to the occurrence of only said narrower pulses produced in response to said trailing edges; and
   common mode control means responsive to the occurrence of noise voltages simultaneously across both of said impedances for disabling said closing means for said second switch and said opening means for said second switch, for preventing said second switch from changing state at the time of occurrence of the noise voltages.

2. A circuit as set forth in claim 1 wherein said means for producing narrower pulses is comprised of:
   a source of operating voltage referenced to said node;
   first and second current generators respectively connected in series with said impedances between said source of operating potential and said first power voltage;
   a rising edge triggered one shot multivibrator coupled between said source of control pulses for said second switch and said first current generator; and
   a falling edge triggered one shot multivibrator coupled between said source of control pulses for said second switch and said second current generator.

3. A circuit as set forth in claim 1 wherein said closing means and opening means for said second switch are comprised of:
   a bistable device having a set input, a reset input and an output;
   means for coupling the narrower pulses produced across one of said impedances in response to said leading edges to said set input so as to cause said device to produce a voltage of one stable state at its output;
   means for coupling said output of said device to said second switch in such manner that said second switch is closed when the voltage of said one stable state is at said output; and
   means for coupling the narrower pulses produced across the other of said impedances in response to said trailing edges to said reset input so as to cause said device to produce a voltage of the other stable state at said output, said means for coupling said output to said second switch being such that said second switch is opened when the voltage of said other stable state is at said output.

4. A circuit as set forth in claim 3 wherein said common mode control means is comprised of:
   disabling means responsive to common mode voltages across said impedances for preventing said means for coupling said narrower pulses to the set and reset input of said bistable device from coupling said narrower pulses to the set and reset inputs of said bistable device.

5. A circuit as set forth in claim 4 wherein:
   said disabling means is more sensitive than either of said means for respectively coupling the narrower pulses to said set and reset inputs of said bistable device 6. A circuit as set forth in claim 5 wherein:
   said disabling means has less delay than either of said means for respectively coupling the narrower pulses to said set and reset inputs of said bistable device.

7. A circuit as set forth in claim 4 wherein:
   said disabling means has less delay than either of said means for respectively coupling the narrower pulses to said set and reset inputs of said bistable device.

8. A method for operating series switches that are referenced to different voltages for preventing false operation of at least one of the switches in the presence of noise or voltage transients, comprising the steps of:
   providing control pulses referenced to the lower voltage for both switches;
   controlling the switch referenced to the lower voltage with its control pulses;
   forming narrow pulses at the leading and trailing ends of the control pulses for the switch referenced to the higher voltage;
   shifting the reference level of the narrow pulses to the higher reference voltage in such manner that the narrow pulses appear across different impedances;
   respectively coupling the narrow pulses across said impedances that occur at the leading and trailing ends of the control pulses to set and reset inputs of a bistable device;
   controlling the second switch with voltages produced at the output of said bistable device; and
   preventing the narrow pulses across said impedances from being coupled to said set and reset inputs of said bistable device when common mode voltages appear across said impedances due to the occurrence of noise or voltage transients.

9. A switching circuit comprising:
   a first switch referenced to a first potential;
   a second switch referenced to a second potential greater than said first potential;
   a first source of current pulses referenced to said first potential;
   a second source of current pulses referenced to said first potential;
   a source of D.C. operating potential referenced to said second potential;

a first impedance connected between said source of operating potential and said first source of current pulses;

a second impedance connected between said source of operating potential and said second source of current pulses;

control means responsive to a voltage across said first resistor for closing said second switch;

control means responsive to a voltage across said second resistor for opening said second switch; and common mode sensing means responsive to voltages simultaneously occurring across said first and second resistors for disabling both of said control means, said common mode sensing means having greater sensitivity than both of said control means.

10. In a circuit having first and second switches connected in series between a first source of operating voltage and a first point of reference potential, the combination comprising:

a source of control pulses;

means for generating first pulses in response to the rising edges of said control pulses;

means for generating second pulses in response to the trailing edges of said control pulses;

a second source of operating voltage referenced to the junction of said first and second switches, said junction serving as a second point of reference potential;

a first current generator and a first resistor connected in series in the order named between said first point of reference potential and said second source of operating voltage;

means for coupling said first pulses to said first current generator in order to cause it to produce corresponding pulses of current through said first resistor;

a second current generator and a second resistor connected in series in the order named between said first point of reference potential and said second source of operating voltage;

means coupling said second pulses to said second current generator so as to cause it to produce corresponding pulses of current through said second resistor;

a latch;

first coupling means for coupling the first resistor so as to set said latch in response to pulses of voltage produced across first resistor by said first pulses of current flowing through it;

second coupling means for coupling the second resistor so as to reset said latch in response to pulses of voltage produced across said second resistor by said second pulses of current flowing through it; and means responsive to common mode voltages appearing across said first and second resistor for preventing said first and second coupling means from respectively setting and resetting said latch.

11. A combination as set forth in claim 10, wherein said first coupling means includes:

a first NAND gate having first and second inputs and an output;

first, second, and third inverters connected in series in the order named between said first resistor and the first input of said first NAND gate; and wherein said second coupling means includes:

a second NAND gate having first and second inputs and an output;

fourth, fifth, and sixth inverters connected in series in the order named between said second resistor and the first input of said second NAND gate;

a common mode control circuit including of a third NAND gate having an output coupled to the second inputs of said first and second NAND gates;

a seventh inverter connected between the first input of said third NAND gate and said first resistor;

an eighth inverter connected between the second input of said third NAND gate and said second resistor; and the sensitivity of said seventh and eighth inverters being greater than the sensitivity of said first and fourth inverters.

12. A circuit for alternately closing first and second switches of a pulsed power supply that are connected in series at a junction in the order named between ground and a power supply voltage, comprising:

a first source of spaced switch control pulses that is referenced to ground;

means for closing said first switch in response to the switch control pulses from said first source;

a second source of spaced switch control pulses that is referenced to ground;

a source of device operating potential referenced to said junction;

a first impedance and a first current generator connected in series between said source of device operating potential an ground;

a leading edge triggered one shot multivibrator coupled between said second source of switch control pulses and said first current generator so as to produce pulses of current through said first impedance in response to the leading edges of the switching pulses provided by said second source;

a second impedance and a second current generator connected in series between said source of device operating potential and ground;

a trailing edge triggered one shot multivibrator coupled between said second source of switch control pulses and said second current generator so as to produce pulses of current through said second impedance in response to the trailing edges of the switching pulses provided by said second source;

a bistable circuit having an output;

first bistable circuit control means coupled between said first impedance and said bistable circuit for putting it in a first state when a pulse of current only flows through said first impedance;

second bistable circuit control means coupled between said second impedance and said bistable circuit for putting it in a second state when a pulse of current only flows through said second impedance;

means for closing said second switch when said bistable circuit is in said first state and for opening it when said bistable circuit is in said second state; and common mode control means responsive to currents flowing simultaneously in said first and second impedances, due to noise or voltage transients, for disabling said first and second bistable circuit control means.

13. A circuit as set forth in claim 12 wherein said common mode control means is more sensitive than said first and second bistable circuit control means.

14. A circuit as set forth in claim 12 wherein said common mode control means has less delay than said first and second bistable circuit control means.

15. A circuit as set forth in claim 13 wherein said common mode control means has less delay than said first and second bistable circuit control means.

16. In combination with a transistor having its conduction path coupled between a first terminal for the application thereto of a relatively high voltage ($V_H$) and a load terminal for the connection thereto of a load, and including a second terminal for the application thereto of a relatively low operating voltage ($V_{OP}$) relative to said load terminal and, further including control means connected between said load terminal and said second terminal for turning said transistor on and off in response to respective first and second control signals, the improvement comprising:

said operating voltage ($V_{OP}$) being referenced to the voltage appearing at said load terminal, for supplying power to said control means, said control means using a portion of said power from said operating voltage for turning on said transistor switch;

first means connected between said second terminal and a source of reference potential for developing said first control signal at a first node during one period of time;

second means connected between said second terminal and said source of reference potential for developing said second control signal at a second node during another period of time; and inhibit means included in said control means for sensing when voltages of similar value appear simultaneously at said first and second nodes, for preventing said transistor switch from changing state.

17. The combination of claim 16, wherein said first and second means include:

first and second resistors connected between said first operating voltage terminal and said first and second nodes respectively; and first and second pulsed current sources connected between said first and second nodes and said source of reference potential, respectively.

18. The combination of claim 16, wherein said control means includes:

bistable device means responsive to said first control signal for setting to turn on said transistor switch, and to said second control signal for resetting to turn off said transistor switch;

said inhibit means being responsive to voltages of similar value at said first and second nodes simultaneously, for causing said bistable device means to be retained in its previous state as long as this voltage condition persists.

19. A control system for producing a signal at an output having a first value in response to the presence of a control signal at a first input node and having a second value in response to the presence of a control signal at a second input node, said system comprising:

a bistable device having set and reset inputs and an output;

first control means for coupling control signals from said first input node to said set input when enabled;

second control means for coupling control signals from said second input node to said reset input when enabled; and third control means coupled to said first and second nodes for enabling said first and second control means when a signal appears at only one of said input nodes and for disabling said first and second control means when noise simultaneously appears at said first and second nodes, said third control means being more sensitive than said first and second control means.

20. A control system as set forth in claim 19 wherein:

said first control means includes a first NAND gate having two inputs and an output, one of its inputs being coupled to said first node and its output being coupled to said set input of said bistable device:

said second control means includes a second NAND gate having two inputs and an output, one of its inputs being coupled to said first node and its output being coupled to said reset input of said bistable device; and said third control means includes a third NAND gate having two inputs and an output, one of its inputs being coupled to said first node; its other input being coupled to said second node and its output being coupled to the other inputs of said first and second NAND gates.

21. A control system as set forth in claim 20 further comprising:

a source of D.C. power voltage having a reference node and a high voltage node;

first and second switches connected in series in the order named between said reference node and said high voltage node and meeting at a junction, each of said switches having a control terminal;

means for coupling said output of said bistable device to the control terminal of said second switch;

a first source of pulses referenced to said reference node and coupled to the control terminal of said first switch so as to make it conductive during said pulse;

means for referencing said first, second and third control means to the junction of said switches;

a second source of pulses, said second source being referenced to said reference node;

means coupled to said second source of pulses and to said first and second nodes for producing at said first and second nodes, respectively, pulses occurring at the ends of pulses from said second source.

22. The combination comprising:

a first power terminal for the application thereto of a relatively high voltage ($V_H$) relative to a point of reference potential;

a transistor switch having its conduction path coupled between said first power terminal and a load terminal for driving any load connected to said load terminal towards the voltage (V ) applied at said first power terminal;

control circuitry connected between the load terminal and a first voltage terminal;

means for applying a first voltage to said first voltage terminal for powering the control circuitry;

means coupling the control circuitry to said transistor switch for turning it on and off, said control circuitry including a first node at which is produced a turn-on signal and a second node at which is produced a turn-off signal; and means in the control circuitry for sensing when the voltages at the first and second nodes are of similar value indicative of a noise or faulty condition and for then generating an inhibit signal for preventing the transistor switch from changing state.

* * * * *